United States Patent
Huang et al.

(10) Patent No.: US 9,136,329 B2
(45) Date of Patent: Sep. 15, 2015

(54) SEMICONDUCTOR STRUCTURE WITH DIELECTRIC-SEALED DOPED REGION

(71) Applicant: Taiwan Semiconductor Manufacturing Company, Ltd., Hsin-Chu (TW)

(72) Inventors: Huan-Tsung Huang, Hsin-Chu (TW); Kuo-Cheng Wu, Hsin-Chu (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/785,927

(22) Filed: Mar. 5, 2013

(65) Prior Publication Data

US 2014/0252426 A1    Sep. 11, 2014

Related U.S. Application Data

(63) Continuation of application No. 11/788,226, filed on Apr. 19, 2007, now Pat. No. 8,415,749.

(51) Int. Cl.
*H01L 29/66* (2006.01)
*H01L 29/06* (2006.01)

(52) U.S. Cl.
CPC ...... *H01L 29/0653* (2013.01); *H01L 29/66636* (2013.01); *H01L 29/66651* (2013.01)

(58) Field of Classification Search
CPC ................. H01L 29/66636; H01L 29/66545; H01L 21/823807; H01L 29/6656
USPC .......................................... 438/303; 257/288
See application file for complete search history.

(56) References Cited

U.S. PATENT DOCUMENTS

| | | | |
|---|---|---|---|
| 6,071,783 A | 6/2000 | Liang et al. | |
| 6,207,482 B1 * | 3/2001 | Shih et al. | 438/230 |
| 6,365,473 B1 | 4/2002 | Lee | |
| 6,376,320 B1 * | 4/2002 | Yu | 438/307 |
| 6,657,223 B1 * | 12/2003 | Wang et al. | 257/19 |
| 7,361,563 B2 | 4/2008 | Shin et al. | |
| 2002/0089003 A1 | 7/2002 | Lee | |
| 2004/0173855 A1 | 9/2004 | Masuoka et al. | |
| 2005/0173735 A1 * | 8/2005 | Li | 257/202 |
| 2005/0280052 A1 * | 12/2005 | Holz et al. | 257/288 |
| 2006/0131657 A1 | 6/2006 | Hamaguchi | |
| 2007/0267703 A1 * | 11/2007 | Chong et al. | 257/368 |
| 2008/0258185 A1 * | 10/2008 | Huang et al. | 257/288 |
| 2008/0315316 A1 | 12/2008 | Jin | |

OTHER PUBLICATIONS

Jurczak, M. et al., "Dielectric Pockets—A New Concept of the Junctions for Deca-Nanometric CMOS Devices," IEEE Transactions of Electron Devices, vol. 48, No. 8, Aug. 2001, pp. 1770-1774.

* cited by examiner

*Primary Examiner* — David Vu
*Assistant Examiner* — Jonathan Han
(74) *Attorney, Agent, or Firm* — Slater & Matsil, L.L.P.

(57) ABSTRACT

Leakage current can be substantially reduced by the formation of a seal dielectric in place of the conventional junction between source/drain region(s) and the substrate material. Trenches are formed in the substrate and lined with a seal dielectric prior to filling the trenches with semiconductor material. Preferably, the trenches are overfilled and a CMP process planarizes the overfill material. An epitaxial layer can be grown atop the trenches after planarization, if desired.

20 Claims, 3 Drawing Sheets

SEMICONDUCTOR STRUCTURE WITH DIELECTRIC-SEALED DOPED REGION

This application is a continuation of U.S. patent application Ser. No. 11/788,226, filed on Apr. 19, 2007, entitled "Semiconductor Structure with Dielectric-Sealed Doped Region," which application is hereby incorporated herein by reference in its entirety.

TECHNICAL FIELD

The present invention relates generally to transistor structures and methods for making same, and more particularly to a novel transistor structure having a dielectric-sealed source and/or drain and methods for making same.

BACKGROUND

The ability to control short channel effects and to reduce leakage current are long felt needs in the semiconductor arts. One of the dominant contributors to standby power consumption is the so-called junction leakage current resulting from unwanted current flow at the p-n junctions. In many modern integrated circuit applications, it is necessary to provide increased channel doping concentrations for improved performance, but these increased channel doping concentrations exacerbate the leakage current problem.

Previous attempts to reduce junction leakage phenomena have included the (limited) use of so-called pocket implants and/or halo implants (although as is known, improving short channel requires heavy halo implants in general). While these approaches may nominally improve leakage current performance, they often bring with them a concomitant degradation in control over the short channel effect, hence worsening device performance.

What is needed in the art is a semiconductor structure that provides for reduced leakage current without degrading short channel effect performance.

SUMMARY OF THE INVENTION

In one aspect, the present invention provides for a semiconductor structure comprising a substrate and a source/drain region formed at least partially within the substrate. The seal dielectric substantially completely enclosing the source/drain region.

In another aspect, the present invention provides for a semiconductor structure comprising a substrate and an isolation feature defining an active region of the substrate. A seal dielectric is formed within the substrate and defines an electrically insulated well region. A first doped region is formed partially within the electrically insulated well region and extends at least partially above the electrically insulated well region.

In yet another aspect, the present invention provides for a method of forming a transistor. The method includes forming a trench in a semiconductor substrate and lining the trench with a seal dielectric layer. The method further includes filling the lined trench with a semiconductor material and doping the semiconductor material with impurities.

In a different aspect, the present invention provides for a method of forming a semiconductor device that includes forming an isolation region to define an active region in a substrate, forming an etch stop layer on the substrate, and defining openings in the layer. The method further includes forming a first trench and a second trench in the active area, the first trench and second trench being aligned with a first and second opening, respectively, in the etch stop layer, and forming a seal dielectric that lines the first trench and second trench, respectively. The method further includes filling the first trench and second trench, respectively, with a semiconductor material, doping the semiconductor material in the first trench and the second trench, respectively, with impurity dopants, and forming a gate dielectric and gate electrode on the substrate, substantially aligned with the first trench and second trench, respectively.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

A preferred method for manufacturing the novel transistor structure will now be described with reference to FIGS. 1a through 1e. Numerous variations to the structure and manufacturing process described herein will become apparent to one skilled in the art when informed by the present disclosure. Those variations are within the contemplated scope of the present invention.

Figure 1A:
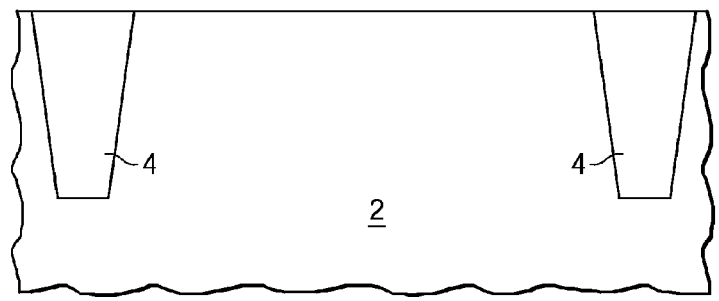
FIGS. 1a through 1e illustrate various steps in the manufacture of an illustrative embodiment device.

FIG. 1a illustrates substrate 2 in which have been formed isolation features 4. Substrate 2 is preferably a silicon substrate, either a bulk silicon wafer or a silicon layer formed as part of a silicon-on-insulator (SOI) wafer. Alternatively, substrate 2 could be a strained silicon-germanium wafer or any other appropriate semiconductor material or layer. Isolation features 4 are illustrated as shallow trench isolation (STI) features, preferably formed using conventional processes. Other isolation features, including other dielectric materials, field oxide, and the like could also be employed. It should be noted that in the cross section view of FIG. 1a, two isolation features 4 are illustrated. One skilled in the art will recognize that, in practice, isolation features 4 are often in the form of a trench that encircles and hence defines an active area in substrate 2. Therefore, illustrated isolation features 4 should be recognized as two separate regions of a common trench isolation feature, which for clarity, is not shown in its entirety.

Figure 1B:
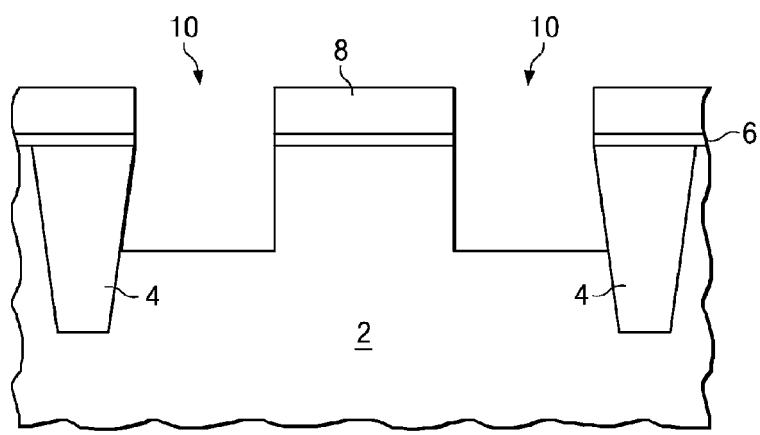

As illustrated in FIG. 1b, thin oxide layer 6 is deposited over the surface of the substrate 2, including over isolation features 4, followed by deposition of silicon nitride layer 8. Oxide layer 6 may be a thermally grown oxide or a deposited oxide formed using, e.g., chemical vapor deposition (CVD), low pressure chemical vapor deposition (LPCVD), plasma enhanced chemical vapor deposition (PECVD), and the like employing, perhaps, a silane-based precursor, tetraethyloxysilane (TEOS) precursor, methylsilsesquioxane (MSQ), or the like. In one embodiment, oxide layer 6 is deposited to a thickness of from about 10 Å to about 500 Å, and preferably about 100 Å. Oxide layer 6 primarily serves to protect the surface of substrate 2 during the subsequent process steps of deposition and subsequent removal of nitride layer 8. Hence, the specific formulation, thickness, and other parameters of oxide layer 6 are not crucial to the present invention, provided oxide layer 6 sufficiently protects the surface of substrate 2.

Nitride layer 8 can also be deposited using various techniques. In one embodiment, nitride layer 8 is deposited by conventional deposition techniques, including plasma enhanced chemical vapor deposition (PECVD) or other well known techniques, preferably to a thickness of from about 50 Å to about 2000 Å, and more preferably a thickness of about 500 Å. Nitride layer 8 serves primarily as an etch stop layer for subsequently performed etch steps, particularly chemical mechanical polishing (CMP) etch steps. Hence, the specific formulation, thickness, and other parameters of nitride layer 8 are not crucial to the invention, provided these functional attributes are met.

As will be apparent to one skilled in the art upon a review of FIG. 1*b*, oxide layer 6 and nitride layer 8 function as a hard mask layer for etching trenches 10 in substrate 2. A photoresist layer (not shown) is blanket deposited over nitride layer 8 and patterned using conventional photolithographic techniques. The pattern of the patterned photoresist layer is then imposed upon nitride layer 8 and oxide layer 6 by appropriate etching processes as are well known in the art. The pattern corresponds to the desired pattern for trenches 10.

While the illustrated embodiment has nitride layer 8 formed over oxide layer 6, alternative embodiments could include an oxide layer formed over a nitride layer. Further alternatively, other materials, including but not limited to silicon oxy-nitride (SiON) could be employed for the hard mask function. As a matter of design choice, oxide layer 6 and nitride layer 8 should have sufficient thickness (collectively) to ensure that the layers are not etched through during the trench etch process and, as addressed above, nitride layer 8 need also be sufficiently thick and/or etch resistant to remain sufficiently intact to perform as a CMP etch stop layer, described more fully below. Preferably, a margin of several hundreds of angstroms would be maintained.

Trenches 10 are then etched into substrate 2 using conventional etch anisotropic techniques to result in the structure illustrated in FIG. 1*b*. One exemplary etch process is a so-called dry etch technique employing a plasma etch. Reactive ion etch could alternatively be used to etch trenches 10, although the higher etch selectively between silicon and nitride offered by plasma etching techniques makes it the presently preferred alternative. A contemplated alternative etch process would involve an isotropic etch. This alternative might provide improved performance at the boundaries of single crystal silicon and polycrystalline silicon, such as will develop in subsequent epitaxial processes. The photoresist layer (not shown) could be stripped prior to the etch trench process, using ashing, oxide plasma, or the like, or could be removed in a separate process step after the etch trench (if any of the photoresist layer remains), or may in fact be removed as an inevitable consequence of the etching process(es) by which nitride and oxide layers 8 and 6 are patterned and/or by which trenches 10 are formed.

Figure 1C:
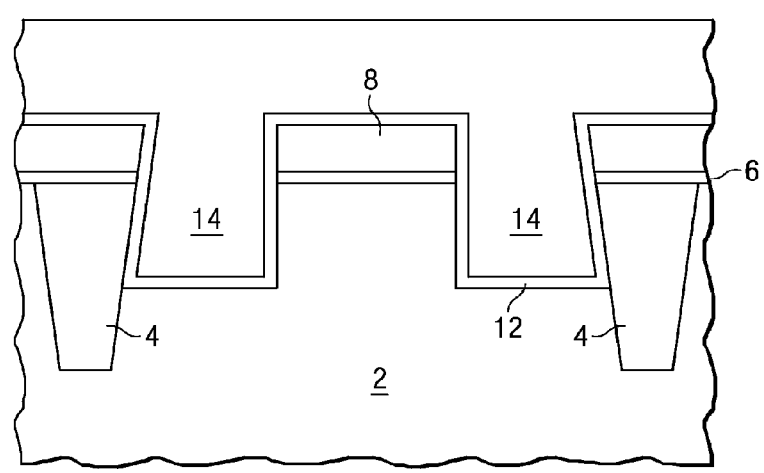

As illustrated in FIG. 1*c*, seal dielectric 12 is formed along the bottom and sidewalls of (each) trench 10. Seal dielectric 12 is preferably an oxide layer formed by thermal growth or deposition. Alternatively, seal dielectric 12 could be formed by a chemical vapor deposition (CVD) process followed by a thermal anneal to densify the film, as is known in the art. Seal dielectric 12 is preferably formed to a thickness of from about 5 Å to about 500 Å and preferably about 20-50 Å. Alternatively, seal dielectric 12 could be formed of some other dielectric material providing good electrical insulative properties, such as any of various well known so-called high-k dielectric materials including but not limited to $TaO_5$, SiON, nitrided oxide and the like. It is contemplated, but not essential, that seal dielectric 12 be formed conformally within trench 10. Furthermore, while seal dielectric layer 12 is shown as a single layer of substantial uniformity throughout the trench, other embodiments are within the contemplated scope and spirit of the present invention, including a composite seal dielectric layer composed of several sub-layers.

As will be apparent to one skilled in the art upon review of the figures and description herein, seal dielectric 12, either alone or in cooperation with isolation features 4, forms an electrically insulated well or lined recess in which a source/drain region will be formed, as more fully described below. Because charge carriers flowing into or out of the source/drain region will be confined to the channel region, leakage current of the resulting device will be substantially reduced. In other words, leakage is suppressed because the source/drain region to substrate junction is now replaced by an interposed dielectric, which substantially reduces the leakage current.

Polysilicon fill 14 is then deposited atop seal dielectric 12, preferably by CVD. As illustrated in FIG. 1*c*, trenches 10 are preferably overfilled with polysilicon fill 14 to ensure that the trenches are completely filled. In an illustrative embodiment, polysilicon fill 14 is deposited to overfill trenches 10 by at least about 50-1000 Å, preferably in the several hundreds of angstroms range. Alternatively, amorphous silicon could be employed in lieu of polysilicon.

Figure 1D:
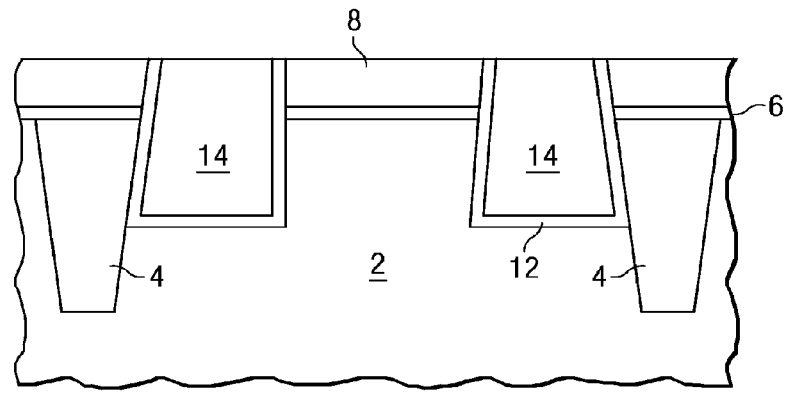

Polysilicon fill 14 is then subjected to a chemical mechanical polish, using techniques well known in the art, to planarize the top surface of polysilicon fill 14 with the surface of nitride layer 8. The resulting structure is illustrated in FIG. 1*d*. It is contemplated that at least some of nitride layer 8 will be removed during the CMP process.

Figure 1E:
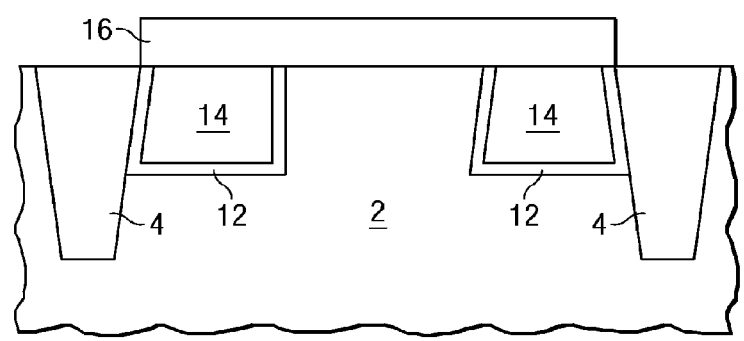

Next, remaining portions of nitride layer 8 and oxide layer 6 are stripped off using conventional etching techniques such as hot phosphoric acid, plasma etch or the like for nitride layer 8 and, perhaps, HF acid for oxide layer 6. As addressed above, oxide layer 6 will serve as a buffer layer and protect the surface of underlying substrate 2 during the removal of nitride layer 8. Processes for removing a thin oxide layer, such as oxide layer 6, without damaging the underlying substrate 2 are well known and include, for instance, HF acid. Then, silicon layer 16 is epitaxially grown over substrate 2 and at least portions of polysilicon fill 14, as shown in FIG. 1*e*. As those skilled in the art will recognize, the epitaxial growth process is substantially self-aligned, as epitaxial growth will take place on exposed silicon surfaces, but not on exposed oxide surfaces. In a preferred embodiment, silicon layer 16 is epitaxially grown to a thickness of from about 20 Å to about 500 Å, and more preferably about 100 Å in a preferred embodiment. Those skilled in the art will recognize that the thickness is influenced by several factors, not the least of which is the technology node (i.e. minimum feature size) being addressed. Optimal thicknesses and ranges can be obtained for a particular application based upon routine experimentation. In some embodiments, silicon layer 16 can be doped in situ during the epitaxial growth process with appropriate n-type or p-type impurities. Alternatively, and preferably, silicon layer 16 is doped using appropriate photolithography and ion implanting process to form source and drain regions. In some embodiments, silicon layer 16 could alternatively be grown with impurities such as germanium, carbon, and the like so that a crystal lattice strain is imposed between silicon layer 16 and underlying substrate 2.

Figure 2:
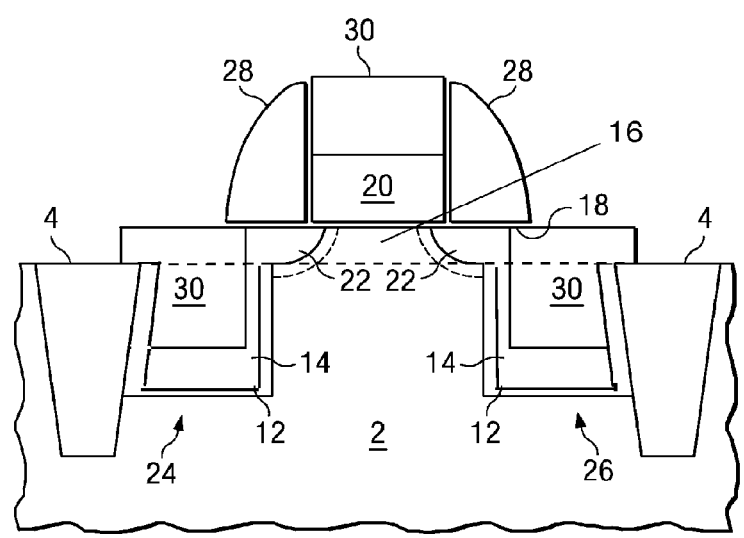
FIG. 2 illustrates an illustrative embodiment structure.

At this stage, essentially conventional CMOS processing steps can be performed to complete a structure, such as a transistor structure illustrated in FIG. 2. For instance, a gate oxide layer is formed over silicon layer 16, followed by formation of a gate electrode layer, preferably polysilicon or metal. The gate oxide layer and gate electrode layer are patterned using well known photolithographic techniques to form gate oxide 18 and gate electrode 20. Shallow extensions 22, sometimes referred to as lightly doped drain (LDD) extensions are implanted into substrate 2. Deep source and drain regions 24 and 26 are also formed, preferably by ion implantation into substrate 2. As illustrated, spacers 28 are formed on sidewalls of gate electrode 20. These spacers 28, preferably oxide, nitride, or combinations of oxides and nitrides, are employed for self-alignment of the source and drain regions 24 and 26, as is known in the art.

Source and drain regions 24 and 26 and gate electrode 20 are then silicided to form silicide regions 30 as is well known in the art. In the illustrated embodiment of FIG. 2, polysilicon fill 14 in which source and drain regions 24 and 26 are formed is only partially silicided. In other embodiments, polysilicon fill layer 14 in which source and drain regions 24 and 26 are formed could be fully silicided, in which case source and drain silicide regions 30 would extend all the way to seal dielectric 12. Likewise, while gate electrode 20 is illustrated as being partially silicided, gate silicide regions 30 could extend through the depth of gate electrode 20 and extend to gate dielectric 18.

Continuing to refer to FIG. 2, then, the structure illustrated depicts in a cross sectional view isolation regions 4 formed into a semiconductor substrate 2 defining an active area, a first trench recess containing source/drain region 24 and spaced apart from gate electrode 20, a channel region underlying gate electrode 20 formed above the surface of the substrate 2 in epitaxially grown layer 16 (as shown in FIG. 1d above), a second trench recess containing source/drain region 26 and spaced apart from the gate conductor 20. The isolation regions 4 extend into the substrate and portions of the source/drain regions 24, 26 are adjacent to and further defined by a sidewall of the isolation features 4. Gate electrode 20 further has vertical sidewalls that are adjacent gate sidewall spacers 28 formed adjacent each side wall of the gate electrode 20. The sidewalls of gate electrode 20 are spaced from the boundary regions of the source and drain regions 24 and 26 defined by the dielectric liners 12 in each region, while the source and drain extension 22 extend towards the channel region underlying the gate electrode 20. The extensions 22 lie under the sidewall spacers 28 and a portion of them may extend beneath the gate conductor 20.

In some preferred embodiments, the thickness of extensions 22 can be carefully controlled to extend only as deep as the thickness of epitaxial silicon layer 16, although this is not a critical feature of all embodiments of the present invention.

An advantageous feature of preferred embodiments of the present invention is that, by sealing source and drain regions 24 and 26 in seal dielectric 12, excellent current isolation can be obtained with less depth for STI regions 4.

While a symmetrical transistor has been illustrated as an exemplary embodiment, other structures are within the contemplated scope of the present invention, including asymmetrical transistors in which, e.g., only one of the source and drain is encased within seal dielectric 12 or the profile of the source and drain regions differ, diodes, and the like.

Figure 3:
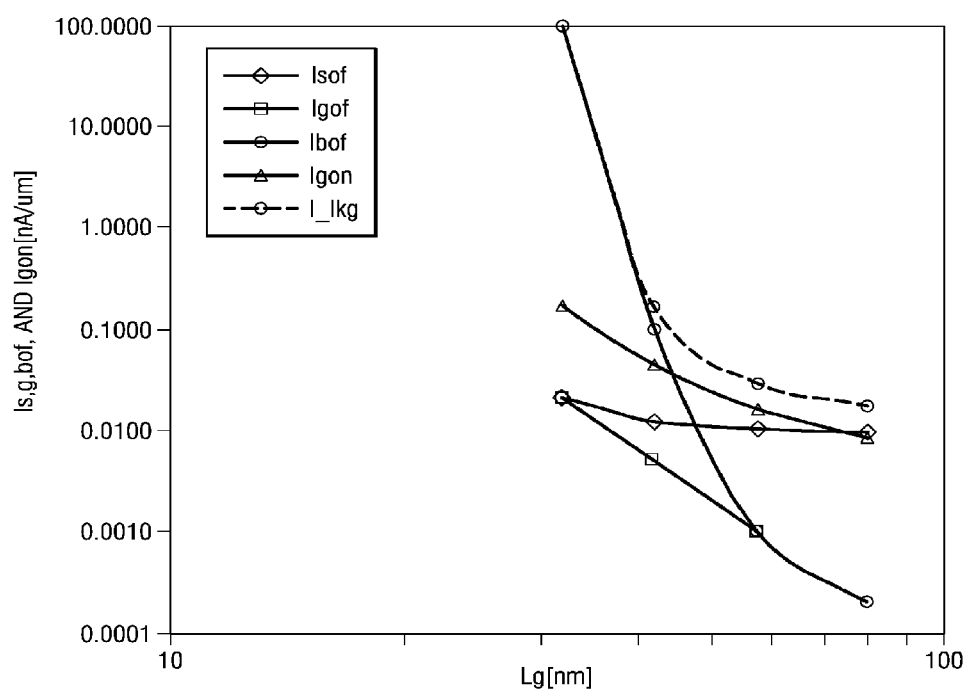
FIG. 3 graphically illustrates the improvement in leakage current performance as a function of gate length for illustrative embodiment structures of the present invention.

Significant improvement in leakage current performance is contemplated with embodiments of the present invention. FIG. 3 illustrates expected improvements in leakage current as a function of gate length when embodiments of the present invention are incorporated into CMOS and similar technology structures.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   forming a recess in a substrate, the recess having a sidewall and a bottom;
   lining the recess with a dielectric material, the dielectric material being on the sidewall and bottom of the recess;
   forming a source/drain material in the recess, the dielectric material being disposed between the source/drain material and the substrate;
   after forming the source/drain material, forming a semiconductor layer over the source/drain material and over and adjoining a portion of the substrate proximate the recess; and
   after forming the semiconductor layer, forming a gate electrode directly over the semiconductor layer.

2. The method of claim 1 further comprising removing excess portions of the dielectric material and the source/drain material to make respective surfaces of the dielectric material, source/drain material, and substrate co-planar.

3. The method of claim 1, wherein a portion of the semiconductor layer directly under the gate electrode consists essentially of a same material in a portion of the substrate adjoining the semiconductor layer.

4. The method of claim 1 further comprising doping the source/drain material and a portion of the semiconductor layer directly over the source/drain material to form a source/drain.

5. The method of claim 1 further comprising siliciding at least a portion of the semiconductor layer directly over the source/drain material.

6. The method of claim 1 wherein the dielectric material is selected from the group consisting essentially of silicon oxide, $TaO_5$, SiON, nitrided oxide, a high-k dielectric, and a combination thereof.

7. A method comprising:
   epitaxially growing a semiconductor layer in a source/drain region of a substrate and in a channel region of the substrate, the source/drain region comprising a source/drain material and a dielectric liner, the dielectric liner being disposed between the source/drain material and the substrate, the semiconductor layer being over the source/drain material and being over and adjoining the substrate in the channel region; and
   after epitaxially growing the semiconductor layer, forming a gate structure over the semiconductor layer.

8. The method of claim 7 further comprising:
   forming a recess in the substrate;
   conformally depositing the dielectric liner in the recess; and
   forming the source/drain material over the dielectric liner in the recess.

9. The method of claim 7, wherein respective surfaces of the substrate, the dielectric liner, and the source/drain material are co-planar.

10. The method of claim 7, wherein the semiconductor layer directly underlying the gate structure consists essentially of a same material in a surface of the substrate that the semiconductor layer adjoins.

11. The method of claim 7 further comprising doping the source/drain material and a portion of the semiconductor layer directly over the source/drain material to form a source/drain.

12. The method of claim 7 further comprising siliciding at least a portion of the semiconductor layer directly over the source/drain material.

13. The method of claim 7 wherein the dielectric liner is selected from the group consisting essentially of silicon oxide, $TaO_5$, SiON, nitrided oxide, a high-k dielectric, and a combination thereof.

14. A method comprising:
- forming a recess in a substrate, the recess having a sidewall and a bottom;
- forming a dielectric material adjoining the sidewall and the bottom of the recess;
- forming a source/drain material on the dielectric material in the recess;
- epitaxially growing a semiconductor layer over the source/drain material and over a channel area of the substrate proximate the recess; and
- forming a gate structure over the semiconductor layer.

15. The method of claim 14 further comprising removing excess portions of the dielectric material and the source/drain material to make respective surfaces of the dielectric material, source/drain material, and substrate co-planar.

16. The method of claim 14, wherein the semiconductor layer directly under the gate structure consists essentially of a same material in a portion of the substrate adjoining the semiconductor layer.

17. The method of claim 14 further comprising doping the source/drain material and a portion of the semiconductor layer directly over the source/drain material to form a source/drain.

18. The method of claim 14 further comprising siliciding at least a portion of the semiconductor layer directly over the source/drain material.

19. The method of claim 14 wherein the dielectric material is selected from the group consisting essentially of silicon oxide, $TaO_5$, SiON, nitrided oxide, a high-k dielectric, and a combination thereof.

20. The method of claim 14 further comprising forming a hardmask over the substrate, the hardmask being over the substrate during the forming the dielectric material and the forming the source/drain material, and wherein before epitaxially growing the semiconductor layer, the hardmask is removed.

* * * * *